United States Patent
Hong

[11] Patent Number: 6,011,442
[45] Date of Patent: Jan. 4, 2000

[54] VOLTAGE CONTROL OSCILLATOR FOR A SEMICONDUCTOR DEVICE

[75] Inventor: Hyun Sung Hong, Ichon, Rep. of Korea

[73] Assignee: Hyundai Electronics Industries Co., Ltd., Kyoungki-do, Rep. of Korea

[21] Appl. No.: 09/102,658

[22] Filed: Jun. 23, 1998

[30] Foreign Application Priority Data

Jun. 26, 1997 [KR] Rep. of Korea ............ 97-27722

[51] Int. Cl.[7] .................................................. H03B 5/24
[52] U.S. Cl. ............................ 331/57; 331/34; 331/177 R
[58] Field of Search ................... 331/34, 57, 116 FE, 331/117 FE, 177 R; 327/281, 288

[56] References Cited

U.S. PATENT DOCUMENTS

| | | | |
|---|---|---|---|
| 4,142,114 | 2/1979 | Green | 307/304 |
| 4,628,214 | 12/1986 | Leuschner | 307/296 R |
| 5,434,820 | 7/1995 | Kim | 365/189.09 |
| 5,767,726 | 6/1998 | Wang | 327/356 |

*Primary Examiner*—David Mis
*Attorney, Agent, or Firm*—Gary M. Nath; Gregory B. Kang; Nath & Associates

[57] ABSTRACT

This invention provides a voltage control oscillator that can reduce swing width and more precisely can control a period of the oscillator by applying a back bias voltage to a back bias terminal of a transistor so that an output pulse of the oscillator is controlled. The present invention comprises a plurality of inverters which are connected to each other in the form of a chain, each inverter having a pull up device and a pull down device; a first control block connected to a bulk of each pull up device to supply a desired voltage to said bulk so that threshold voltage of each pull up device is controlled; and a second control block connected to a bulk of each pull down device to supply a desired voltage to said bulk of each pull down device so that threshold voltage of each pull down device is controlled. The present invention can precisely control the oscillator since variation width of the period is small and can minimize a circuit without addition of a buffer since swing width is constant.

9 Claims, 2 Drawing Sheets

VOLTAGE CONTROL OSCILLATOR FOR A SEMICONDUCTOR DEVICE

BACKGROUND OF THE INVENTION

1. Field of the Invention

This invention relates to a voltage control oscillator for a semiconductor device, and more particularly to a voltage control oscillator which can controll the oscillation period of an oscillator by way of an input voltage.

2. Description of a Related Prior Art

Generally, a voltage control oscillator (VCO) has a plurality of inverters 10, 12, 14, 16, 18, which are connected to each other in the form of a chain, and a plurality of transistors 20, 22, 24, 26, 28 each of which is connected to a supply voltage input terminal of each inverter as shown in FIG. 1. A supply voltage applied to the inverters 10, 12, 14, 16, and 18 controls an output period of a ring oscillator. It is desirable that the number of inverters be an odd number. The voltage control oscillator obtains a desired period by controlling a gate voltage of the transistors 20, 22, 24, 26, 28.

However, it is necessary to closely control the gate voltage to obtain a desired period. Also, a separate buffer is necessary to maintain a constant swing width since noise margin decreases with variation of swing width.

SUMMARY OF THE INVENTION

Therefore, it is an object of the present invention to provide a voltage control oscillator that can maintain a constant swing width without a separate buffer.

It is an another object of the present invention to provide a voltage control oscillator that can precisely control an output period and decrease reduction of swing width by controlling a period of an output pulse by means of a back bias voltage of a transistor.

A voltage control oscillator according to a first embodiment of the present invention comprises a plurality of inverters which are connected to each other in the form of a chain, each inverter having a pull up device and a pull down device; and a control block connected to a bulk of each pull up device to supply a desired voltage to said bulk, thereby controlling a threshold voltage of each pull up device.

A voltage control oscillator according to the second embodiment of the present invention comprises a plurality of inverters which are connected to each other in the form of a chain, each inverter having a pull up device and a pull down device; and a control block connected to a bulk of each pull down device to supply a desired voltage to said bulk, thereby controlling a threshold voltage of each pull down device.

A voltage control oscillator according to the third embodiment of the present invention comprises a plurality of inverters which are connected to each other in the form of a chain, each inverter having a pull up device and a pull down device;

a first control block connected to a bulk of each pull up device to supply a desired voltage to the bulk, thereby controlling threshold voltage of each pull up device; and a second control block connected to a bulk of each pull down device to supply a desired voltage to the bulk of each pull down device, thereby controlling a threshold voltage of each pull down device.

A voltage control oscillator of a semiconductor device comprises a plurality of inverters which are connected to each other in the form of a chain, each inverter having a pull up device and a pull down device;

a first control block connected to a bulk of each pull up device to supply a desired voltage to said bulk, thereby controlling a threshold voltage of each pull up device; and a second control block connected to a bulk of each pull down device to supply a desired voltage to said bulk of each pull down device, thereby controlling a threshold voltage of each pull down device.

BRIEF DESCRIPTION OF THE DRAWINGS

For a full understanding of the nature and objects of the present invention, reference should be made to the following detailed descriptions made in conjunction with the accompanying drawings in which.

The same reference characters refer to the same parts through the several views of the drawings.

DETAILED DESCRIPTION OF THE INVENTION

Below, this invention will be explained with reference to attached drawings.

Figure 1:
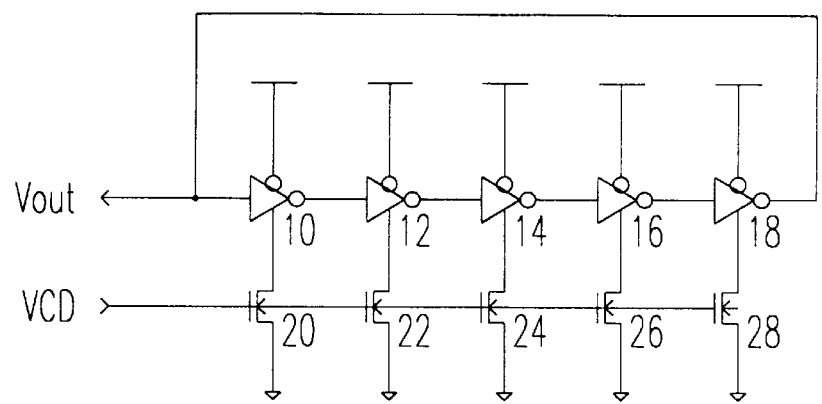
FIG. 1 illustrates a conventional voltage control oscillator.
Figure 2:
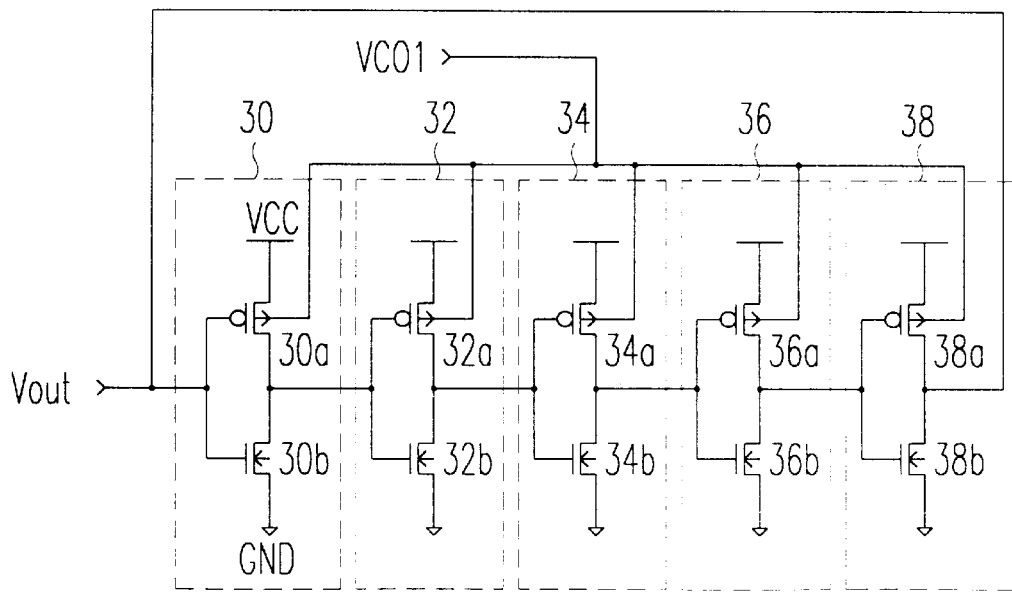
FIG. 2 ilustrates an internal circuit of a voltage control oscillator according to the first embodiment of the present invention.

FIG. 2 illustrates an internal circuit of a voltage control oscillator according to the first embodiment of the present invention. The voltage control oscillator has a first inverter 30, a second inverter 32, a third inverter 34, a fourth inverter 36 and a fifth inverter 38 which are connected to each other in the form of a chain. The first inverter 30 has a PMOS transistor 30a operated as a pull up device and a NMOS transistor 30b operated as a pull down device. The second inverter 32 has a PMOS transistor 32a operated as a pull up device and a NMOS transistor 32b operated as a pull down device. The third inverter 34 has a PMOS transistor 34a operated as a pull up device and a NMOS transistor 34b operated as a pull down device. The fourth inverter 36 has a PMOS transistor 36a operated as a pull up device and a NMOS transistor 36b operated as a pull down device.

Each back bias electrode of the PMOS transistors 30a, 32a, 34a, 36a and 38a, consisting an odd number amount of transistors, is connected to a first control block (VCO1) in common. Furthermore, it is desirable that potential voltage of the first control block (VCO1) is maintained voltage higher than VCC at its minimum.

When a back bias voltage of the PMOS transistors 30a, 32a, 34a, 36a and 38a consisting an odd number amount of transistors is increased by the first control block VCO1 in order to slow pulse period of an output VOUT of the inverters 30, 32, 34, 36 and 38 consisting of odd number, each threshold voltage of the PMOS transistors 30a, 32a, 34a, 36a and 38a consisting of odd number is increased, whereby pulse period of the output VOUT become slower.

Figure 3:
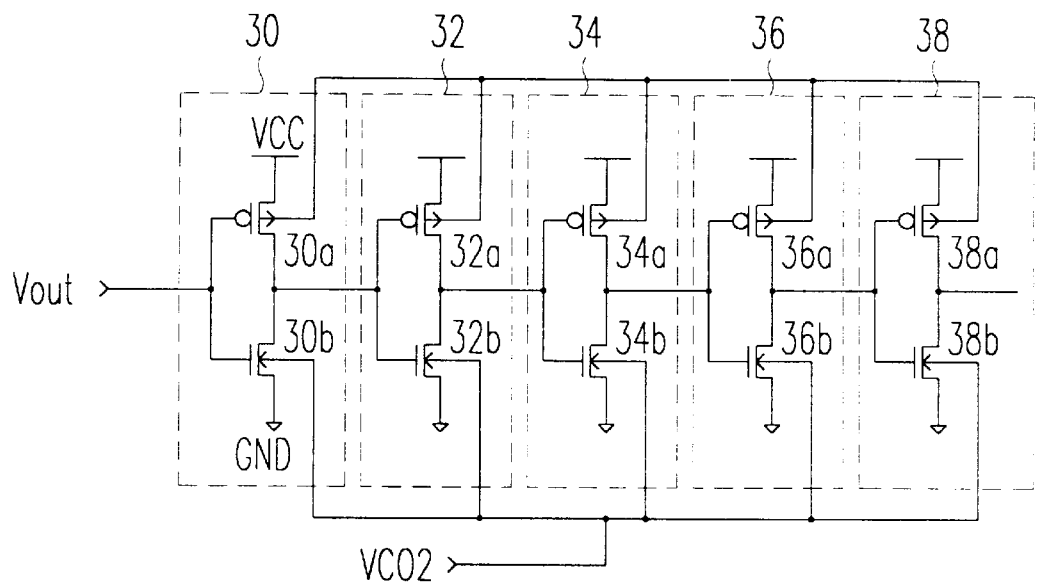
FIG. 3 illustrates an internal circuit of a voltage control oscillator according to the second embodiment of the present invention.

On the contrary, when a back bias voltage of the PMOS transistors 30a, 32a, 34a, 36a and 38a consisting of odd number is reduced by the first control block VCO1, each threshold voltage of the PMOS transistors 30a, 32a, 34a, 36a and 38a consisting of odd number is lowered, whereby pulse period of the output Vout is quickened. FIG. 3 is a circuit illustrating an international construction of a voltage control oscillator according to a second embodiment of the present invention and is similar to construction of the first embodiment.

The differing points between the first embodiment and the second embodiment are as follows. In the first embodiment, each back bias terminal of the PMOS transistors 30a, 32a, 34a, 36a and 38a consisting of odd number is commonly connected to the first control block. In the second embodiment, each back bias terminal of the NMOS transistors 30b, 32b, 34b, 36b and 38b consisting of odd number is commonly connected to the second control block VCO2.

Also, in the first embodiment, the potential of the first control block VCO1 requires a potential higher than VCC at its minimum. While, in the second embodiment, the potential of the second control block VCO2 requires a potential lower than ground at its maximum.

According to the second embodiment of the present invention, when a back bias voltage of the NMOS transistors 30b, 32b, 34b, 36b and 38b consisting of odd number is reduced by the second control block VCO2 in order to slow pulse period of an output VOUT of the inverters 30, 32, 34, 36 and 38 consisting of odd number, each threshold voltage of the NMOS transistors 30b, 32b, 34b, 36b and 38b consisting of odd number is increased, whereby pulse period of the output VOUT becomes slower.

On the contrary, when a back bias voltage of the NMOS transistors 30b, 32b, 34b, 36b and 38b consisting of odd number is increased by the first control block VCO1, each threshold voltage of the NMOS transistors 30b, 32b, 34b, 36b and 38b consisting of odd number is lowered, whereby pulse period of the output Vout becomes quickened.

Figure 4:
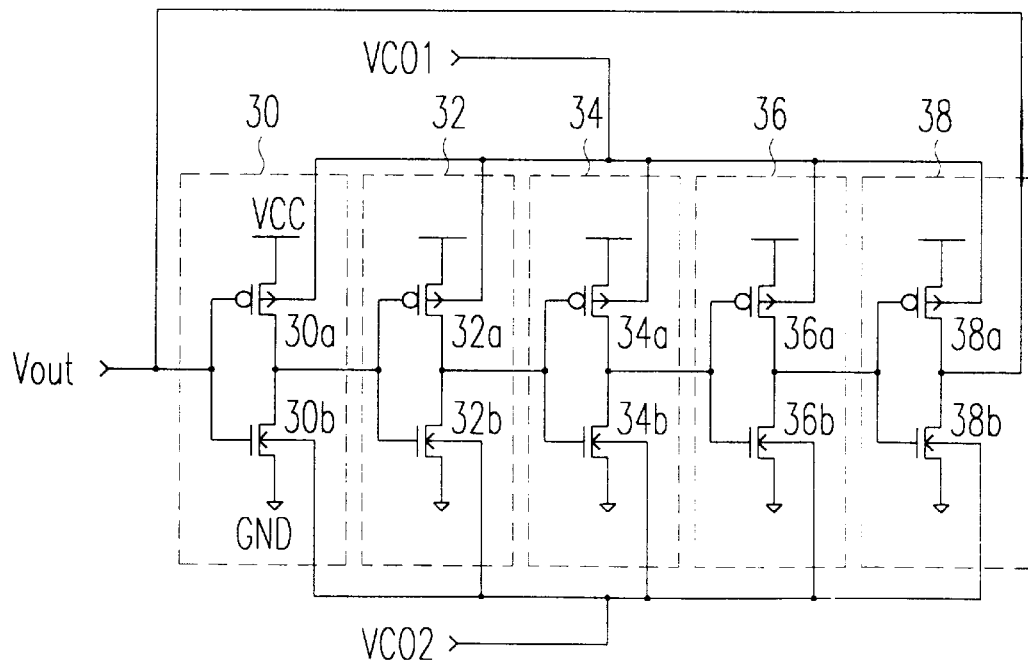
FIG. 4 illustrates an internal circuit of a voltage control oscillator according to the third embodiment of the present invention.

In the mean time, FIG. 4 is a circuit illustrating an international construction of a voltage control oscillator according to a third embodiment of the present invention and is similar to construction of combining the first and second embodiments.

That is, the third embodiment consists of a plurality of inverters 30, 32, 34, 36 and 38, each inverter having a corresponding pull up transistor 30a, 32a, 34a, 36a or 38a, and a corresponding pull down transistor 30b, 32b, 34b, 36b or 38b. The inverters consists an odd number amount of inverters and are connected from each other in form of a chain.

A difference between the third embodiment, and the first and second embodiments is that each back bias terminal of the PMOS transistors 30a, 32a, 34a, 36a and 38a consisting an odd number amount of transistors is commonly connected to the first control block VCO1, while each back bias terminal of the NMOS transistors 30b, 32b, 34b, 36b and 38b consisting of odd number is commonly connected to the second control block VCO2.

In addition, in the third embodiment, it is desirable that the potential of the first control block VCO1 require a potential higher than VCC at its minimum while, the potential of the second control block VCO2 requires a potential lower than ground at its maximum.

According to the third embodiment, in order to slow the pulse period of an output VOUT of the inverters 30, 32, 34, 36 and 38 consisting of odd number, a back bias voltage of the PMOS transistors 30a, 32a, 34a, 36a and 38a consisting of odd number is increased while a back bias voltage of NMOS transistors 30b, 32b, 34b, 36b and 38b consisting an odd number amount of transistors is reduced by the first control block VCO1.

As each threshold voltage of the NMOS transistors 30b, 32b, 34b, 36b and 38b consisting of odd number as well as each threshold voltage of the PMOS transistors 30a, 32a, 34a, 36a and 38a consisting of odd number is increased, pulse period of the output VOUT becomes slow.

On the contrary, when a back bias voltage of the PMOS transistors 30a, 32a, 34a, 36a and 38a consisting of odd number is reduced while a back bias voltage of NMOS transistor 30b, 32b, 34b, 36b and 38b consisting of odd number is increased by the first control block VCO2, each threshold voltage of the NMOS transistors 30b, 32b, 34b, 36b and 38b consisting of odd number as well as each threshold voltage of the PMOS transistors 30a, 32a, 34a, 36a and 38a consisting of odd number is lowered, pulse period of the output Vout becomes quick.

As described above, according to the voltage control oscillator of the present invention, threshold voltage of each transistor is applied to a control block by controlling a back bias voltage of each transistor, thereby controlling period of an out pulse. Accordingly, variation width of the period is smaller than a conventional voltage control oscillator. It is possible to precisely control the oscillator and to minimize a circuit without addition of buffer since a swing width is constant.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A voltage control oscillator of a semiconductor device comprising:
    a plurality of inverters which are connected to each other in the form of a chain, each inverter having a pull up device and a pull down device; and
    a control block connected to a bulk of each pull up device to supply a desired voltage to said bulk, thereby controlling a threshold voltage of each pull up device.

2. The oscillator of claim 1, wherein potential of said control block is set to a potential higher than VCC.

3. The oscillator of claim 2, wherein pulse period of a final output of said inverters is slow when a back bias voltage of each pull up device is increased, and wherein pulse period of a final output of said inverters is quick when a back bias voltage of each pull up device is lowered.

4. A voltage control oscillator of a semiconductor device comprising:
    a plurality of inverters which are connected to each other in the form of a chain, each inverter having a pull up device and a pull down device; and
    a control block connected to a bulk of each pull down device to supply a desired voltage to said bulk, thereby controlling a threshold voltage of each pull down device.

5. The oscillator of claim 4, wherein a potential of said control block is set to a potential lower than ground potential.

6. The oscillator of claim 5, wherein pulse period of a final output of said inverters is quick when a back bias voltage of each pull down device is increased, and wherein pulse period of a final output of said inverters is slow when a back bias voltage of each pull up device is lowered.

7. A voltage control oscillator of a semiconductor device comprising:
a plurality of inverters which are connected to each other in the form of a chain, each inverter having a pull up device and a pull down device;
a first control block connected to a bulk of each pull up device to supply a desired voltage to said bulk, thereby controlling a threshold voltage of each pull up device; and
a second control block connected to a bulk of each pull down device to supply a desired voltage to said bulk of each pull down device, thereby controlling a threshold voltage of each pull down device.

8. The oscillator of claim 7, wherein potential of said first control block is set to a potential higher than VCC, and a potential of said second control block is set to a potential lower than ground potential.

9. The oscillator of claim 7, wherein pulse period of a final output of said inverters is slow when a back bias voltage of each pull up device and each pull down device is decreased, and wherein pulse period of a final output of said inverters is quick when a back bias voltage of each pull up device is lowered and a back bias voltage of each pull down device is increased.

* * * * *